(12) United States Patent
Tout, Jr. et al.

(10) Patent No.: US 6,188,023 B1
(45) Date of Patent: Feb. 13, 2001

(54) COST EFFECTIVE SHEET METAL PLATE INSTALLATION

(75) Inventors: James J. Tout, Jr., Boca Raton, FL (US); Frank C. LaPlaca, Ontario, NY (US); William V. Cranston, Boca Raton, FL (US); Jack K. Koenig, Charlott, NC (US); John E. McCloskey, Boca Raton, FL (US)

(73) Assignee: International Business Machines Corporation, Armonk, NY (US)

( * ) Notice: Under 35 U.S.C. 154(b), the term of this patent shall be extended for 0 days.

(21) Appl. No.: 09/257,691

(22) Filed: Feb. 26, 1999

(51) Int. Cl.[7] .................................................. H02G 3/14
(52) U.S. Cl. .............................. 174/66; 174/67; 220/241; 220/242
(58) Field of Search .................... 174/66, 67; 220/241, 220/242; 362/95; D8/353; D13/177; 24/563

(56) References Cited

U.S. PATENT DOCUMENTS

| | | | |
|---|---|---|---|
| 4,425,725 | * | 1/1984 | Moustakas et al. ............... 40/725 |
| 4,449,015 | * | 5/1984 | Hotchkiss et al. ............. 174/138 F |
| 4,737,599 | * | 4/1988 | Fontaine ........................ 439/135 |
| 4,780,573 | * | 10/1988 | Own ................................. 174/66 |
| 4,800,239 | * | 1/1989 | Hill ................................. 174/66 |
| 4,810,833 | * | 3/1989 | Meyers ........................... 174/67 |
| 5,107,075 | * | 4/1992 | Currier, Jr. ..................... 174/67 |
| 5,221,814 | * | 6/1993 | Colbaugh et al. ............... 174/66 |
| 5,664,955 | * | 9/1997 | Arnett ........................... 439/135 |
| 5,955,700 | * | 9/1999 | Slipy et al. .................... 174/50 |

FOREIGN PATENT DOCUMENTS

2194395 * 3/1988 (GB) .................................. 174/66

* cited by examiner

Primary Examiner—Kristine Kincaid
Assistant Examiner—Dhiru R Patel
(74) Attorney, Agent, or Firm—Fleit,Kain,Gibbons, Gutman & Bongini P.L.; Jon A. Gibbons

(57) ABSTRACT

A cover assembly with a rectangular cover for covering an opening at a predetermined height in a receiving part formed by stamping and bending a sheet of material with the opening formed in the receiving part. The rectangular cover with a first pair of opposite sides and a second pair of opposite sides, with the second pair of opposite sides have been formed to create a side wall of a given height with a tab finger. Two or more Z-shaped side walls of a predetermined height are formed around the opening of the receiving member. The Z-shaped side walls receive the first pair of opposite side of the rectangular cover. A tab opening is formed in the receiving member. The tab opening receives the tab finger of the rectangular cover. The side wall of the rectangular cover formed so that the given height of the side wall is less than the predetermined height of the two Z-shaped side walls so as to enclose a region of the opening of the receiving member with the flange of the rectangular cover therewith.

12 Claims, 4 Drawing Sheets

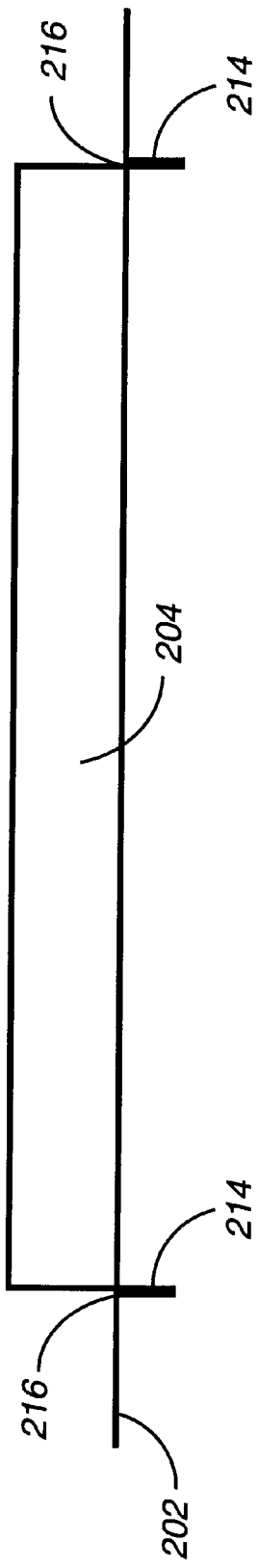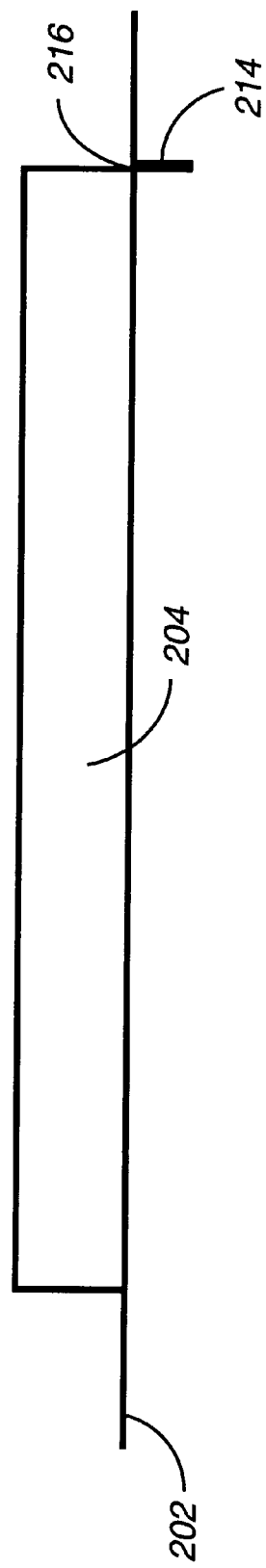

COST EFFECTIVE SHEET METAL PLATE INSTALLATION

CROSS-REFERENCE TO RELATED APPLICATIONS

Not applicable

BACKGROUND OF THE INVENTION

1. Field of the Invention

The invention disclosed broadly relates to the field of enclosures and chassis for electronics and other devices, and more particularly relates to the field of cover fabrication, especially sheet metal plate cover fabrication.

2. Description of the Related Art

Although the use of plastic enclosures has been increasing over the last few years, sheet metal enclosures are still used for certain applications. One application is in the area of enclosures for electronics and speciality Personal Computers PCs. The use of metal has many desirable characteristics over plastic. One desirable characteristic is the relatively lower expense to set up fixturing and/or tooling for a limited product chassis and enclosures. Another desirable characteristic is the ability to reduce the emissions of electro-magnetic-waves emanating from the enclosed electronic circuitry. Still, another desirable characteristic is the durability of sheet metal in many applications such as in industrial environments over plastics. Yet still another desirable characteristic is flame and fire retardant such as meeting the UL (Underwriters Laboratory) 5 V specification.

One speciality product in which sheet metal enclosures have been used is a wall hanging PC. The wall hanging PC as the name suggests provides a PC chassis or system unit that can hang on the wall rather than taking up desk space or floor space. The Canadian Standards Association (CSA) specification 22.2 No. 950 Manual Section 4.4.6 and UL 1950 for wall mounted PCS states that the maximum opening on the bottom of the unit cannot be greater than two millimeters (2 mm) in diameter. Many times the requirements for cooling devices such as fans, and the requirements for cabling and connecting to other equipment makes this maximum opening specification difficult to meet. To meet this requirement often suppliers of chassis for wall mounted PCs use covers and grommets to fill or cover holes larger than the 2 mm. maximum opening. One cover that is difficult and expensive to make is the cover for a fan opening on a PC power supply. This cover can typically be 50 millimeters or more in diameter. The cover must be fastened securely in place so that it will not rattle or be dislodged thereby violating the CSA and UL specification. Many manufactures attach covers by use of spot welds or by the use of mechanical fasteners such as screws or rivets. This method of fastening although effective in minimizing the possibility of dislodging a cover, is expensive. Manufactures must build jigs for welding and add a step of spot welding during the assembly of the sheet metal chassis. If screws or other mechanical fasteners are used, the steps of drilling holes, aligning holes and securely mounting fasteners must be performed. Each of these additional steps or processes during the manufacturing of a metal chassis adds cost to the final product. Accordingly, a need exists to provide a method and apparatus to reduce cost of mounting covers on stamped or formed openings.

The need to cover openings that may protrude from a chassis or that may be recessed in a chassis is often required. Many PC components such as the power supply have protrusions from it for the fans and other components such as removable pluggable units and subassemblies. Covers for these protruding or recessed openings are often welded in the case of metal, glued in the case of non-metals such as plastics or fastened in place using mechanical fasteners. The need to fabricate covers having different offsets or depths with respect to a chassis or enclosure is required. Therefore, a need exists to provide a cost effective method and apparatus to provide cover assemblies of a variety of depths.

SUMMARY OF THE INVENTION

Briefly, in accordance with the present invention, a method to manufacture a cover for an opening comprising the steps of: fabricating a rectangular cover having a first pair of opposite sides and a second pair of opposite sides; forming a flange in at least one of the second pair of opposite sides; fabricating a receiving member having at least one opening; forming at least two Z-shaped side walls around one of the openings for receiving the first pair of opposite sides of the rectangular cover there within; and forming at least one tab opening for receiving at least one tab finger of the rectangular cover. In accordance with another embodiment of the present invention, a cover assembly is disclosed that is fabricated using the above method.

BRIEF DESCRIPTION OF THE DRAWINGS

FIG. 3 a cross sectional view of the cover assembly of FIG. 2 taken along the axis X–X' detailing the tab fingers.

FIG. 4 a cross sectional view of the cover assembly of FIG. 2 taken along the axis X–X' detailing the tab fingers for an alternate embodiment.

DETAILED DESCRIPTION OF AN EMBODIMENT

Figure 1:
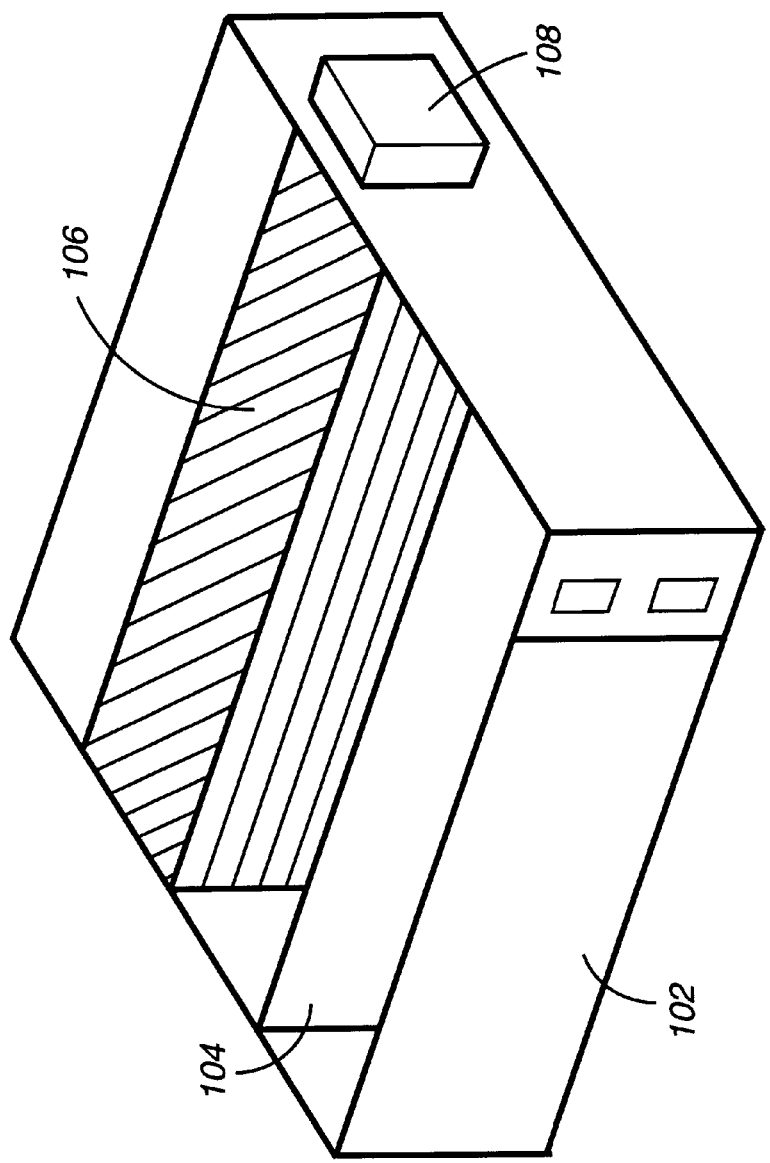
FIG. 1 is an elevational view of a chassis for a Personal Computer using the cover assembly according to the present invention.

FIG. 1 is an elevational view of a chassis for a PC using the cover assembly according to the present invention. A chassis 102, holds a standard PC power supply with a cover assembly 108.

Figure 2:
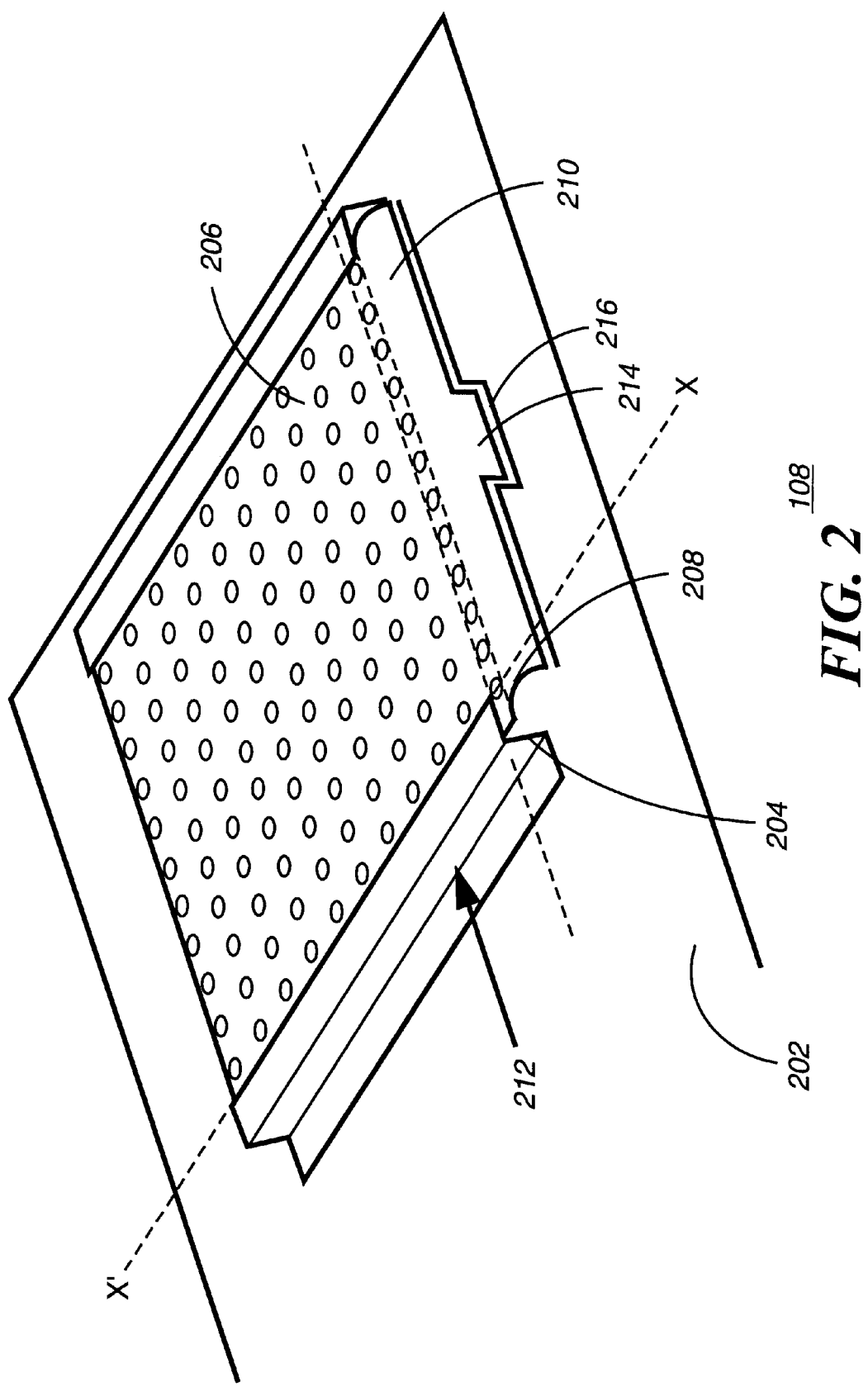
FIG. 2 is an elevational view of the cover assembly according to the present invention.

Referring to FIG. 2, is an elevational view of the cover assembly 108 according to the present invention. The receiving plate 202 is stamped and formed using sheet metal fabrication techniques. In this embodiment, the receiving plate 202 is formed from commercially available 1.2 mm thick sheet metal. The exact thickness, or type of metal or material to form the receiving plate is not important. The material type and thickness will vary upon the type of application for the receiving plate 202. An opening 203 shown in FIG. 5 in the sheet metal receiving plate 202 has two side walls 204 that are Z-shaped when viewed from the side. This Z-shape feature is further illustrated in FIG. 5. The Z-shaped side wall 204 is formed in a sheet metal jig using known forming processes such as stamping and bending. In another embodiment, the receiving plate 202 as well as the Z-shaped side wall 204 are formed from plastic using injection molding processes. A standard cover 206 is formed with the proper dimensions so that the sides 208 of the cover are within the dimensions of the distance between the Z-shaped walls 204. The cover is inserted into the receiving plate 202 using a press-fit operation in the direction shown in FIG. 5. When the cover 206 is inserted into the receiving plate 202, the side walls 210 of the cover 206 deflect slightly inward as a result of the opening in the receiving plate 202. Once the side walls 210 on each side of the cover 206 clear the top surface of the receiving plate 202, the side walls 210 have a spring action that secure the cover 206. The Z-shaped walls 204 resting on the top surface of the receiving plate 202 keep it from moving in the other direction. The tabs 214 on each of the side walls 210 fit into a notch 216 in the receiving plate. When the tabs 214 are secured into the notches 216, the cover 206 is prevented from becoming slidable. If plate rattling is of concern, the fingers of the tabs 214 can be made slightly longer than the thickness of the receiving plate 202 so that when the power supply or other device is secured in place, the cover 206 is held firmly in place and prevented from rattling from vibrations caused during operation of the equipment. This feature is further illustrated in FIG. 3 which is a cross sectional view of the cover assembly of FIG. 2 taken along the axis X–X' detailing the tab fingers It will be appreciated to those skilled in the art that the cover assembly 108 can be fabricated using simple stamping and bending techniques. It will also be appreciated to those skilled in the art, that cover 206 can be slidably inserted in the Z-shaped walls and is held into place by the force 212 from the Z-shaped walls in combination with the tab 214 inserted into opening 216. This combination of clamping action enables the cover to be securely mounted without the further need of mechanical fasteners, glue or welding. In another embodiment, the one of the two walls 210 of cover 206 is not bent down but slides into a Z-shaped walls 204 as shown in FIG. 4. In this embodiment only one wall 210 is formed on the cover 206.

The cover 206 in this embodiment although perforated with openings 216 to enable air flow such as that required by a power supply fan in a PC, can be formed for applications where air flow is not desirable, such as option covers that permit the installation of options in a chassis or enclosure using receiving plate 202. Alternately, the cover 206 may provide assess to an internal chassis enclosed with receiving plate 202. The cover 206 may also be made from plastic or other equivalent materials using injection molding fabrication techniques.

Figure 5:
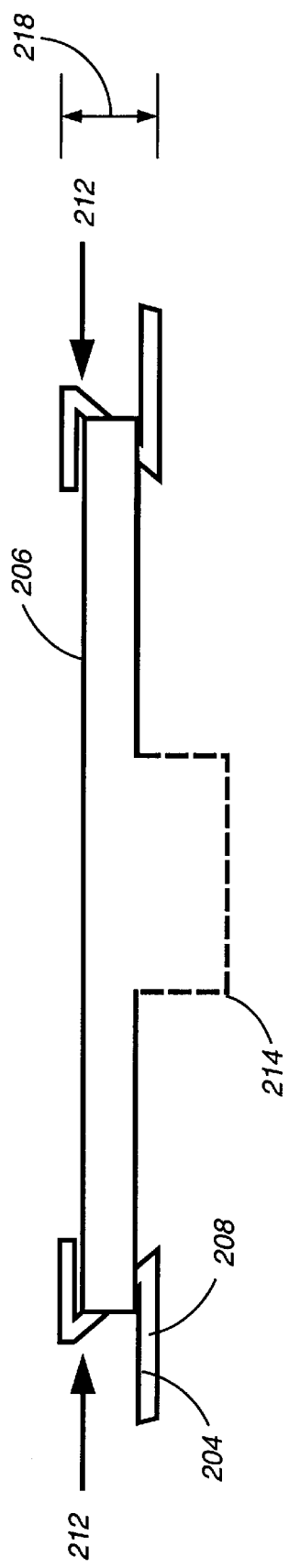
FIG. 5 a side view of the cover assembly of FIG. 2 detailing the Z-shaped side walls according to the present invention.

In another embodiment, the height of the 218 of the Z-shaped side wall 204 in FIG. 5 and the corresponding height of the wall 210 with tab 214 of cover 206 is adjusted up or down so as to enable the accommodation of parts such as fans on PC power supplies that often must protrude beyond the receiving plate 202 or chassis enclosure. In this embodiment for the protruding PC power supply fan, the height 218 is 10 mm. The greater the height 218 of the Z-shaped side walls 204 and the corresponding height of the wall 210 of the cover 206, the greater in depth of the protrusion is created. If for a specific application, instead of a protrusion but rather a recession in the receiving plate 202 is required the entire cover assembly 108 can be inverted so that the Z-shaped walls 204 point into the chassis cavity instead of up and away from the chassis cavity as shown in FIGS. 1–5.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A cover assembly for covering an opening at a predetermined height in a receiving part comprising: a rectangular cover having a first pair of opposite sides and a second pair of opposite sides, wherein at least one of the second pair of opposite sides has been formed to create a side wall of a given height with at least one tab finger; and a receiving member formed from a single continuous sheet of material having at least one opening formed therein; the receiving member having at least two Z-shaped side walls of a predetermined height formed around the at least one opening for receiving the first pair of opposite sides of the rectangular cover there within; and the receiving member having the at least one opening for receiving at least one tab finger of the rectangular cover so that the given height of the side wall of the rectangular cover is less than the predetermined height of the two Z-shaped side walls so as to enclose a region of the at least one opening of the receiving member with the side wall of the rectangular cover therewith.

2. The cover assembly in claim 1, wherein the cover is formed from metal.

3. The cover assembly in claim 1, wherein the receiving member is formed from metal.

4. The cover assembly in claim 1, wherein the cover is formed from plastic.

5. The cover assembly in claim 1, wherein the receiving member is formed from plastic.

6. The cover assembly in claim 1, wherein the cover is perforated so as to allow air flow.

7. A method to manufacture a cover assembly for an opening at a predetermined height, comprising the steps of: fabricating a rectangular cover having a first pair of opposite sides and a second pair of opposite sides; forming a side wall of a given height in at least one of the second pair of opposite sides; fabricating a receiving member from a single continuous sheet of material having at least one opening; forming at least two Z-shaped side walls of a predetermined height around the at least one opening for receiving the first pair of opposite sides of the rectangular cover there within; and forming at least one opening for receiving at least one tab finger of the rectangular cover so that the given height of the side wall of the rectangular cover is less than the predetermined height of the two Z-shaped side walls so as to enclose a region of the opening of the receiving member with the side wall of the rectangular cover therewith.

8. The method according to claim 7 wherein the step of fabricating the cover comprises fabricating the cover from metal.

9. The method according to claim 7 wherein the step of fabricating the receiving member comprises fabricating the receiving member from metal.

10. The method according to claim 7 wherein the step of fabricating the cover comprises fabricating the cover from plastic.

11. The method according to claim 7 wherein the step of fabricating the receiving member comprises fabricating the receiving member from plastic.

12. The method according to claim 7, wherein the step of fabricating the cover comprises fabricating a cover with perforations so as to allow air flow.

* * * * *